United States Patent
Joh et al.

(10) Patent No.: US 12,027,468 B2
(45) Date of Patent: Jul. 2, 2024

(54) STRAPPED COPPER INTERCONNECT FOR IMPROVED ELECTROMIGRATION RELIABILITY

(71) Applicant: TEXAS INSTRUMENTS INCORPORATED, Dallas, TX (US)

(72) Inventors: Jungwoo Joh, Allen, TX (US); Young-Joon Park, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 173 days.

(21) Appl. No.: 17/176,995

(22) Filed: Feb. 16, 2021

(65) Prior Publication Data

US 2021/0257312 A1  Aug. 19, 2021

Related U.S. Application Data

(60) Provisional application No. 62/982,168, filed on Feb. 27, 2020, provisional application No. 62/975,844, filed on Feb. 13, 2020.

(51) Int. Cl.
| | |
|---|---|
| *H01L 23/552* | (2006.01) |
| *H01L 21/48* | (2006.01) |
| *H01L 21/768* | (2006.01) |
| *H01L 23/522* | (2006.01) |
| *H01L 23/532* | (2006.01) |
| *H01L 29/78* | (2006.01) |
| *H05K 1/02* | (2006.01) |

(52) U.S. Cl.
CPC ......... *H01L 23/552* (2013.01); *H01L 21/486* (2013.01); *H01L 21/76802* (2013.01); *H01L 23/5226* (2013.01); *H01L 23/53228* (2013.01); *H01L 29/7816* (2013.01); *H05K 1/0216* (2013.01)

(58) Field of Classification Search
CPC .............. H01L 23/552; H01L 21/486; H01L 21/76802; H01L 23/5226; H01L 23/53228; H01L 29/7816; H01L 21/76834; H01L 23/5283; H01L 23/53238; H01L 23/53295; H05K 1/0216
See application file for complete search history.

(56) References Cited

U.S. PATENT DOCUMENTS 5,767,546 A      6/1998  Williams et al.
10,189,705 B1 *  1/2019  Campanella Pineda ..................... B81C 1/00246

(Continued)

OTHER PUBLICATIONS

"Electromigration path in Cu thin-film lines", Appl. Phys. Lett., vol. 74, No. 20, May 17, 1999.

(Continued)

*Primary Examiner* — Karen Kusumakar
(74) *Attorney, Agent, or Firm* — Andrew R. Ralston; Frank D. Cimino

(57) ABSTRACT

A semiconductor device a strapped interconnect line, which in turn includes a first interconnect line at a first level above a semiconductor substrate, and a second interconnect line at a second level above the interconnect substrate. A dielectric capping layer is located directly on the first interconnect line. A plurality of strapping vias are connected between the first interconnect line and the second interconnect line. Each of the strapping vias extends from a first side of the first interconnect line to a second side of the second interconnect line.

28 Claims, 10 Drawing Sheets

(56) References Cited

U.S. PATENT DOCUMENTS

2006/0289994 A1* 12/2006 Greenberg ............ H01L 23/528
　　　　　　　　　　　　　　　　　　　　　　257/E23.151
2020/0111736 A1*  4/2020 Amanapu ........... H01L 23/5226
2020/0327208 A1* 10/2020 Shao ........................ G03F 1/36

OTHER PUBLICATIONS

"Electromigration in thin aluminum films on titanium nitride", J. Appl. Phys., vol. 47, No. 4, Apr. 1976.
"Relationship between interfacial adhesion and electromigration in Cu metallization", Journal of Applied Physics 93, 1417 (2003); https://doi.org/10.1063/1.1532942.
"Comparison of Cu electromigration lifetime in Cu interconnects coated with various caps", Appl. Phys. Lett. 83, 869 (2003); https://doi.org/10.1063/1.1596375.
"Lateral Smart-Discrete Process and Devices based on Thin-Layer Silicon-on-Insulator", Letavic et al., Proceedings of 2001 International Symposium on Power Semiconductor Devices & ICs, Osaka, p. 407-410.
"Electromigration Current Limit Relaxation for Power Device Interconnects", Joh et al., Proceedings of the 30th International Symposium on Power Semiconductor Devices & ICs May 13-17, 2018, Chicago, USA, p. 68-71.
"Current Crowding Impact on Electromigration in AI Interconnects", Park et al., Analog Technology Development, Texas Instruments, Dallas, TX, U.S.A.
"A Novel Self-Aligned Surface-Silicide Passivation Technology for Reliability Enhancement in Copper Interconnects", Takewaki et al., 1995 Symposium on VLSI Technology Digest of Technical Papers, p. 31-32.

* cited by examiner

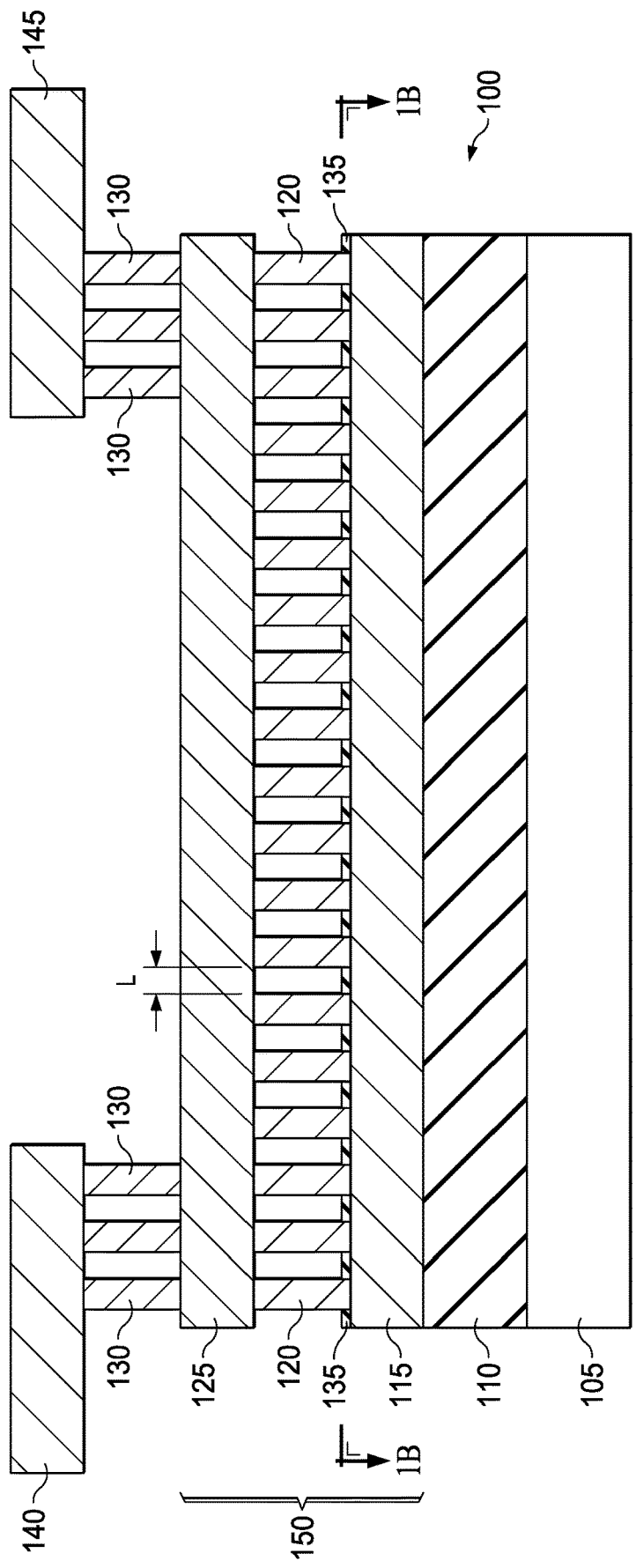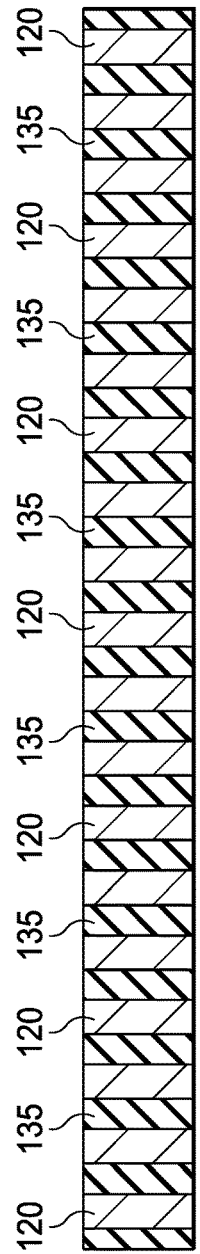
FIG. 1A
FIG. 1B

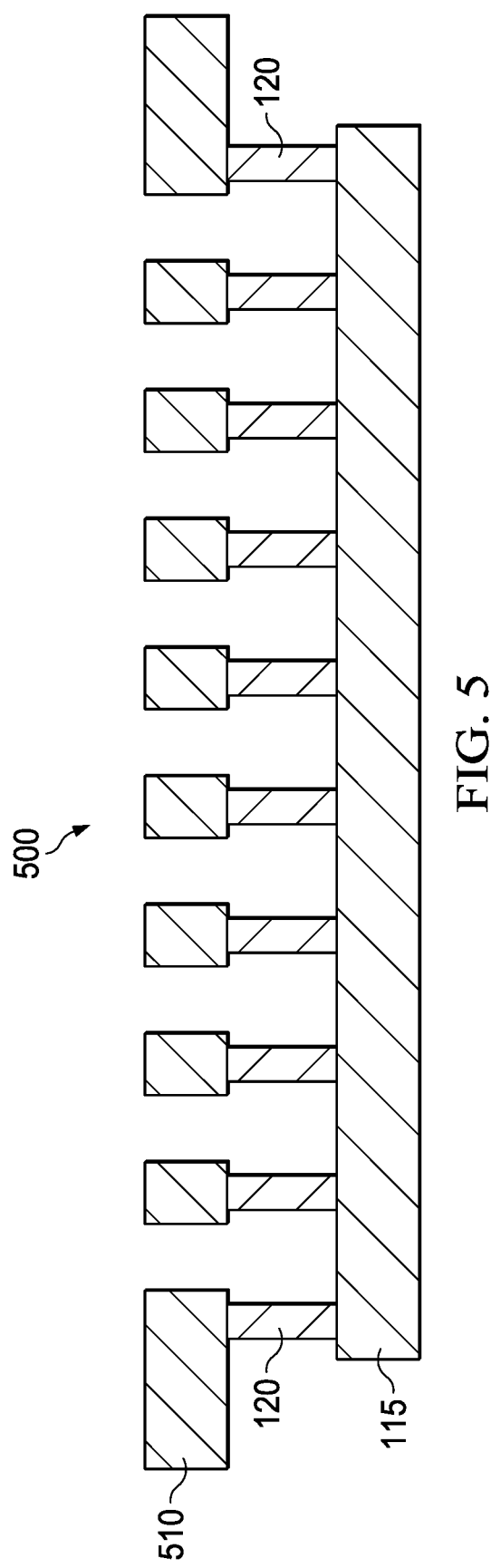

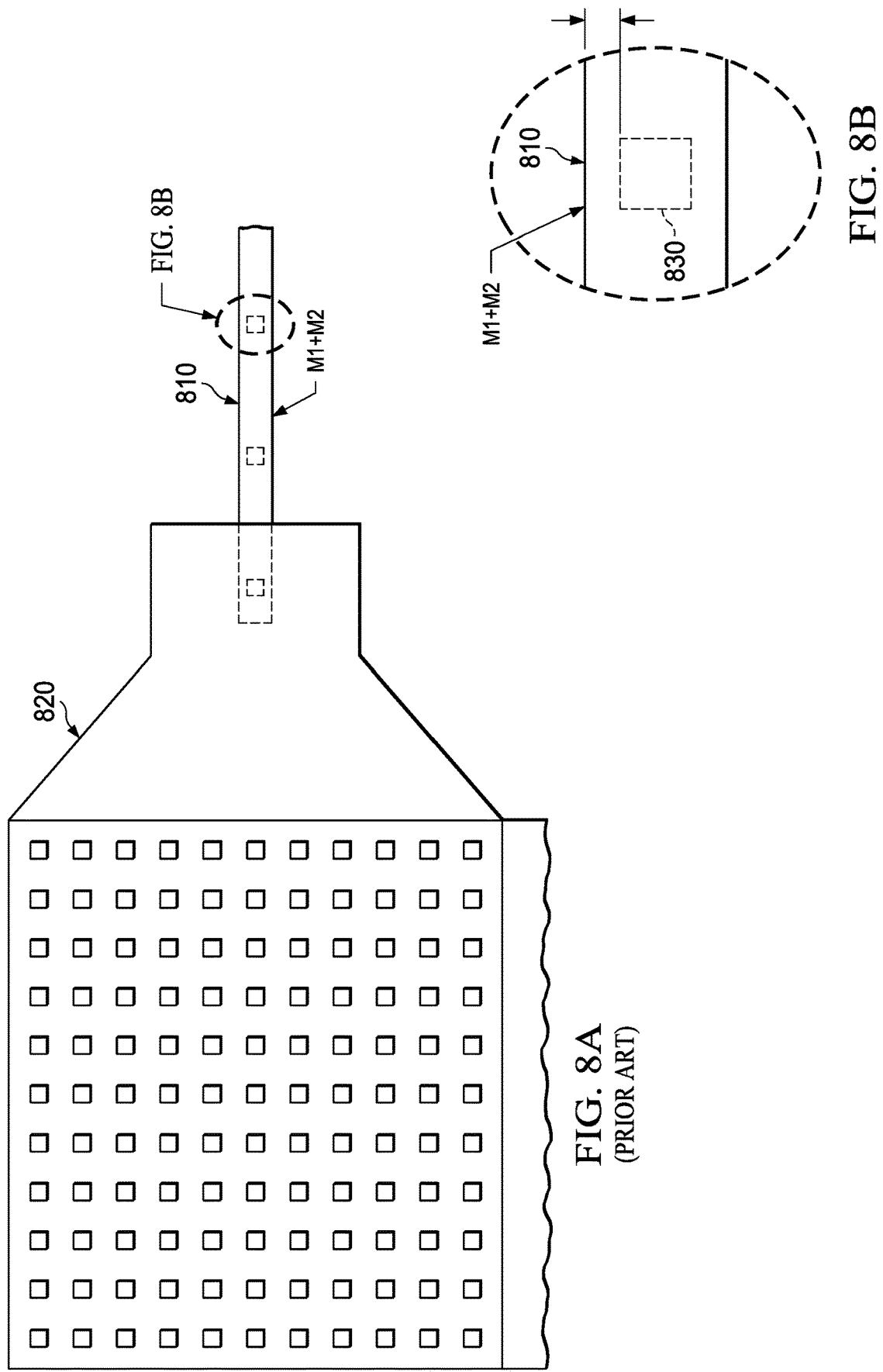

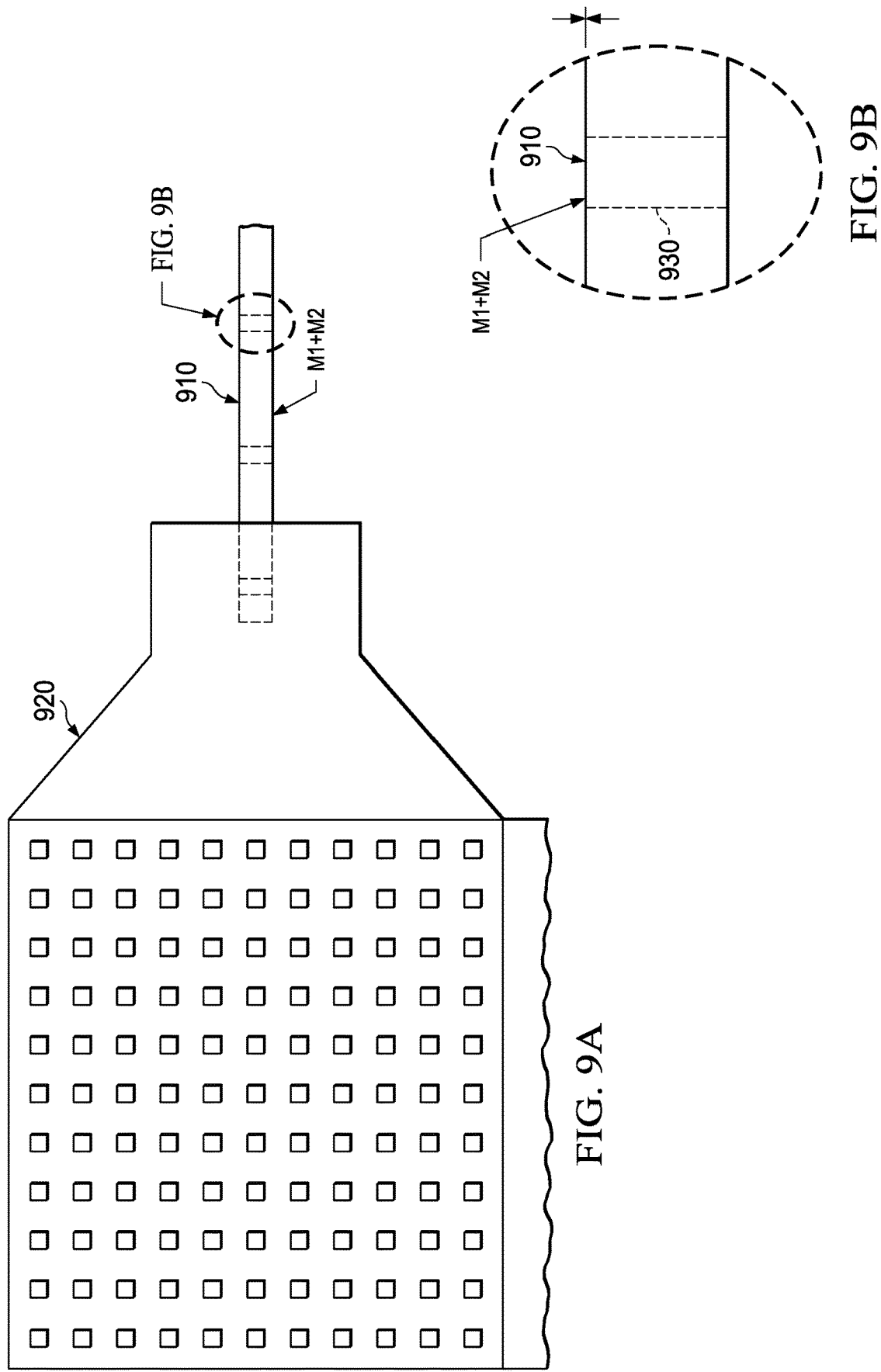

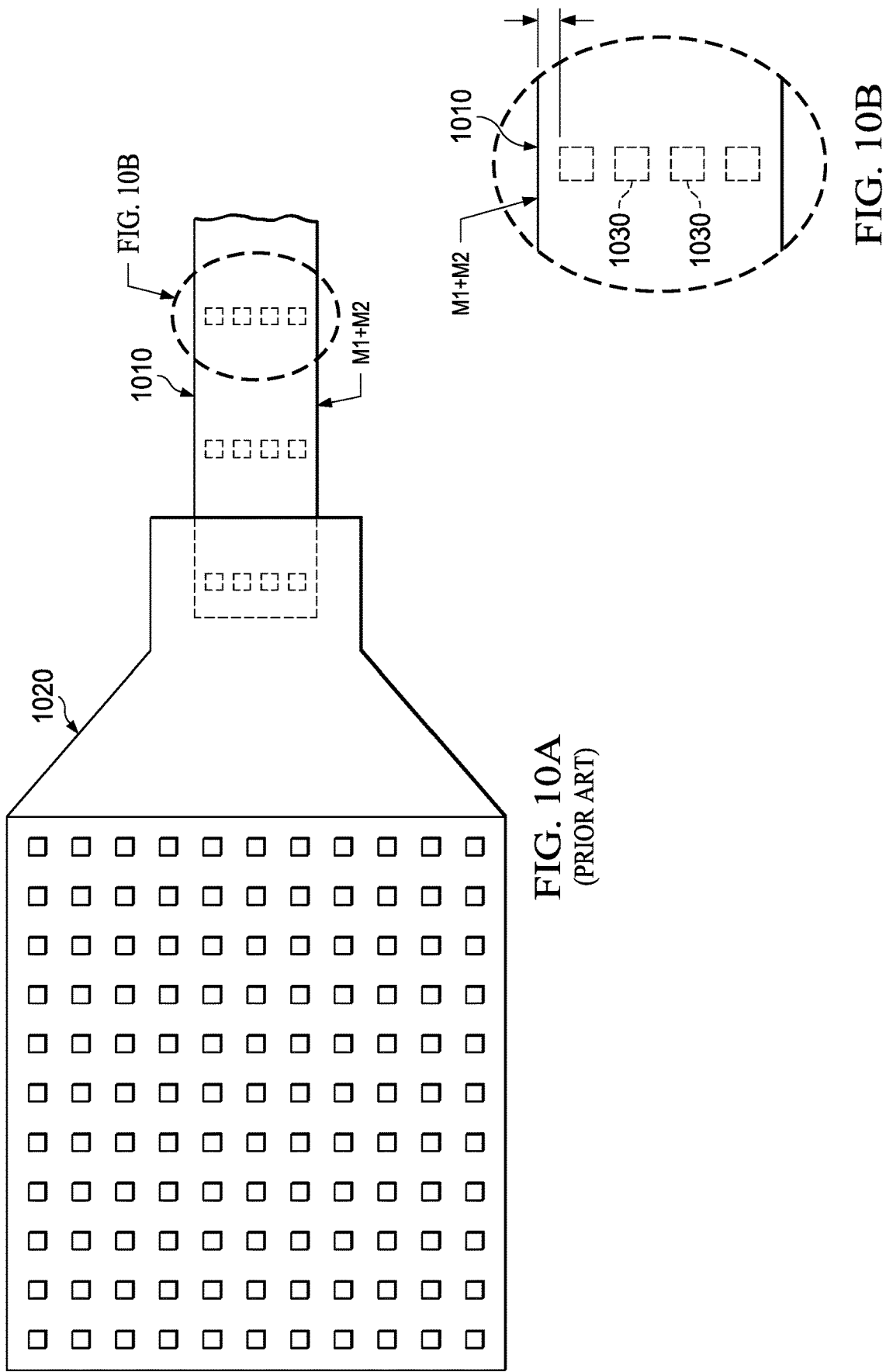

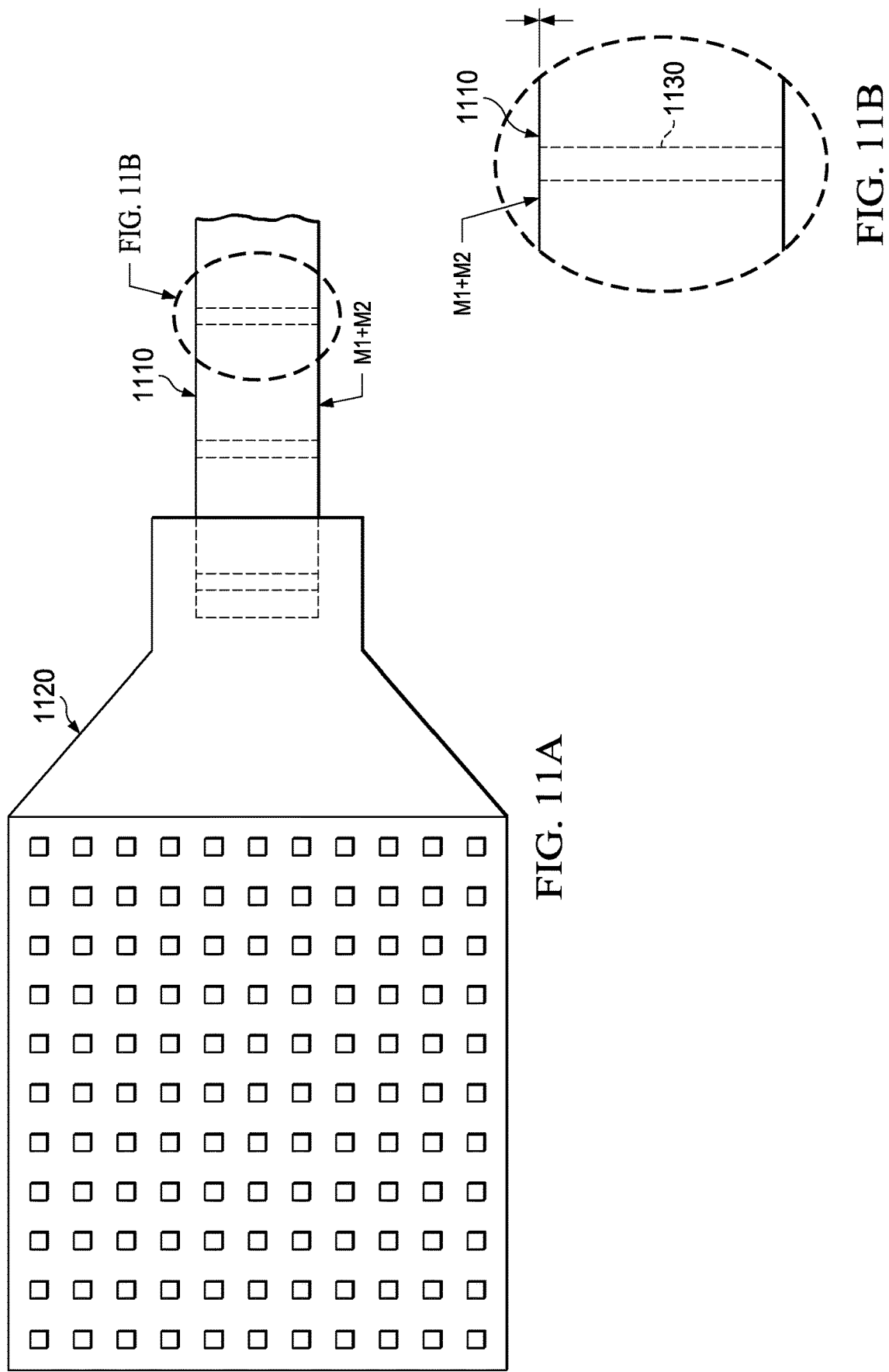

STRAPPED COPPER INTERCONNECT FOR IMPROVED ELECTROMIGRATION RELIABILITY

CROSS-REFERENCE TO RELATED APPLICATIONS

This application claims priority to U.S. Provisional Patent Application Ser. No. 62/975,844, filed on Feb. 13, 2020, and U.S. Provisional Patent Application Ser. No. 62/982,168, filed on Feb. 27, 2020, each of which is incorporated herein by reference in its entirety.

TECHNICAL FIELD

This disclosure relates to the field of semiconductor devices, and more particularly, but not exclusively, to structures and methods for improved electromigration reliability of copper interconnects, e.g. in power applications.

BACKGROUND

Current can cause electromigration (EM) damage in integrated circuit (IC) interconnects that carry sufficiently high current density, for example including but not limited to power device interconnects. Such effects may include void formation in current paths, which generally increases resistance of the current path and may eventually result in failure, e.g. high resistance, in the current path. To reduce the effects of electromigration, the current density may be limited to a value that does not cause a significant increase of resistance over the design life of the IC. Lowering the current density may include placing and routing wide interconnects, which results in a larger die size than would otherwise be necessary. Therefore, enhanced EM entitlement would help to reduce the die size.

SUMMARY

The inventors disclose various methods and devices that may be beneficially applied to power applications in integrated circuits (ICs), for example interconnects with high current density. While such embodiments may be expected to provide improvements in performance and/or lifetime of such ICs, no particular result is a requirement of the present invention unless explicitly recited in a particular claim.

Examples provide semiconductor devices and methods of making the same. A semiconductor device includes a strapped interconnect line, which in turn includes a first interconnect line at a first level above a semiconductor substrate, and a second interconnect line at a second level above the semiconductor substrate. A dielectric capping layer is located directly on the first interconnect line. A plurality of strapping vias are connected between the first interconnect line and the second interconnect line. Each of the strapping vias extends from a first side of the first interconnect line to a second side of the second interconnect line.

BRIEF DESCRIPTION OF THE DRAWINGS

For a detailed description of various examples, reference will now be made to the accompanying drawings in which:

FIGS. 1A and 1B illustrate an example of the disclosure of a strapped interconnect line for high power, high current applications, the strapped interconnect line including a plurality of strapping vias between interconnect lines on different metal levels;

FIG. 5 illustrates a sectional view of a test device that includes strapping vias landing on the bottom metal level of a device similar to that shown in FIG. 1A, with the top level metal omitted such that all current flows in the bottom metal level;

FIG. 8A shows portions of a narrow strapped interconnect structure consistent with conventional practice, while inset FIG. 8B shows a conventional overlap between the metal line and a strapping via;

FIG. 9A shows portions of a narrow strapped interconnect structure consistent with the disclosure, while inset FIG. 9B shows zero overlap between the metal line and a strapping via;

FIG. 10A shows portions of a wide strapped interconnect structure consistent with conventional practice including spaced apart groups of multiple strapping vias, while inset FIG. 10B shows a conventional overlap between the metal line, and top and bottom strapping vias;

FIG. 11A shows portions of a wide strapped interconnect structure consistent with the disclosure including spaced apart strapping bar vias, while inset FIG. 11B shows zero overlap between the metal line and the bar via.

DETAILED DESCRIPTION

Figure 2:
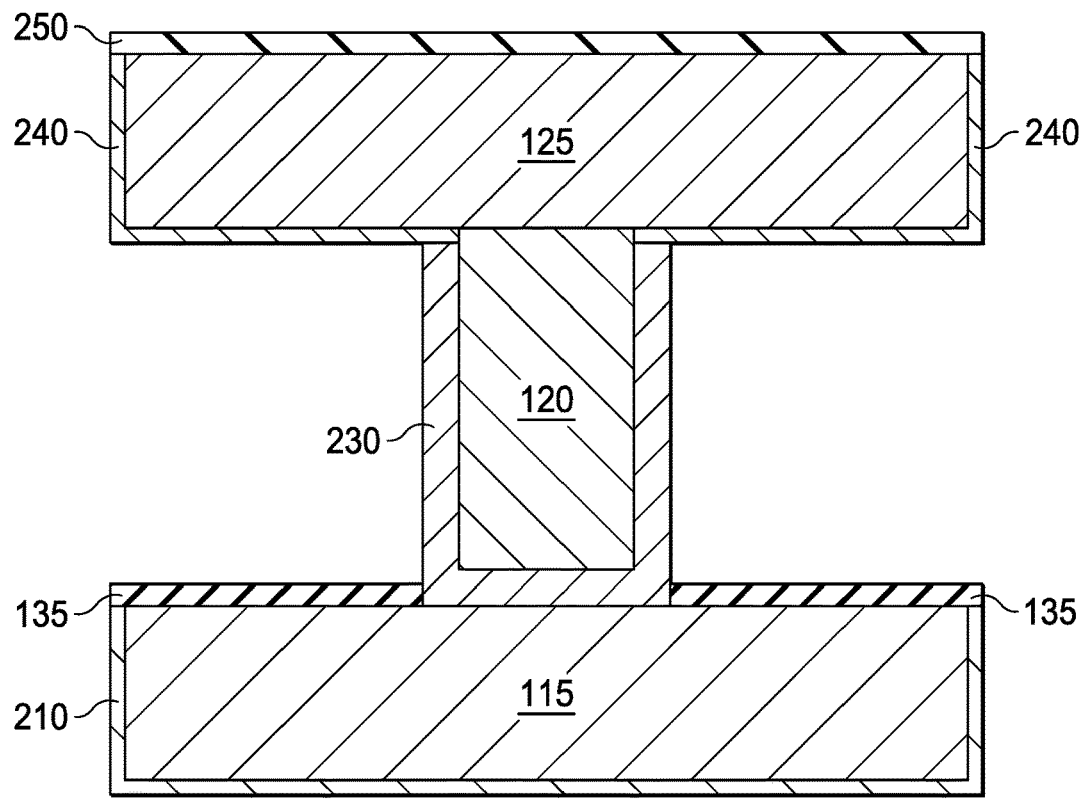
FIG. 2 shows a detail view of one strapping via, including barrier layers substantially limit diffusion of copper from the interconnect lines.

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Toward a goal of reducing die size, the present disclosure provides strapped interconnect lines that may have as much as five times or more the electromigration (EM) lifetime as conventional strapped interconnect lines of the same dimensions. The interconnect lines are strapped by vias that not only shunt current between the strapped lines, but also reduce diffusion of metal atoms in the interconnect lines. The described examples may require little or no modification of existing process flows, and are expected to provide enhanced current carrying capability beneficial for advanced power devices with low on-resistance.

EM induced damage in metal layers is a key reliability concern in lateral power devices as some metal layers may carry large amount of current, and have a commensurately high current density. Some previous proposals to increase current-carrying capability without increasing the risk of EM-induced failures include a holistic failure criteria method, multi-finger redundancy, and current crowding disposition. While such methods may have a demonstrable benefit, additional simpler strategies are needed to improve the resistance of interconnects to EM in high power (high current) devices.

This work demonstrates that "strapped" copper interconnects may have significantly greater resistance to EM failure than baseline interconnect systems. In various examples metal interconnect lines are strapped together by vias that span the width of the lines and are spaced closely together. Such structures have been found to effectively suppress copper diffusion under high current density, as further described below, thus providing an effective alternative to known methods of improving EM lifetime in strapped interconnect lines.

Copper interconnects have a different EM diffusion path as compared to aluminum interconnects. For the latter case, the major diffusion path of aluminum in the interconnect is understood to occur along grain boundaries. In contrast, diffusion of copper in copper interconnects is understood to occur along an interface between the copper line and an overlying dielectric capping layer, e.g. silicon nitride, that is typically used in copper damascene structures. Various strategies have been explored to limit such diffusion, such as interface cleaning/treatment, copper silicidation, and capping the top interface with metallic layers. However, these methods typically would require significant modification of semiconductor device process flows, or may degrade reliability by other mechanisms than electromigration.

Regarding the layout impact on EM performance, the well-known Blech effect and associated Blech length may be leveraged to improve the EM lifetime of physically short interconnects for which atomic diffusion is blocked at both ends due to the dimensional constraint of the short line. If the interconnect length is short and the atomic diffusion is confined between the ends of the line, the atomic flux driven by electromigration is understood to pile up at the end of the short interconnect line. The flux will eventually generate mechanical stress that suppresses further electromigration induced atomic flux. As a result, the EM lifetime of a line whose length is similar to or shorter than the Blech length will typically be greater than that of a line that is much longer than the Blech length.

While the benefit of the Blech effect can be realized by designing interconnects with short lengths in a power device, it is not always feasible to do so as some interconnects need to carry large currents over long distances.

The inventors have determined that an alternative method of increasing EM lifetime is possible with copper interconnects while allowing for long interconnect lines in power devices or other integrated circuits. Because copper diffusion occurs along the surface of the interconnect line, atomic diffusion may be limited by periodically blocking the diffusion path along the surface. As described in greater detail below, the inventors have discovered that the copper diffusion path may be limited to the Blech length or less by periodically interrupting the copper-dielectric cap interface of a lower-level line with a barrier metal used to form an overlying copper via used to strap the lower line to an overlying line. By spacing the vias close together the effective length of the diffusion path may be limited to the distance between the vias, and electromigration of the copper may be significantly reduced, thereby increasing the EM lifetime.

FIG. 1A illustrates an example integrated circuit (IC) 100 including a copper interconnect system. A semiconductor substrate 105 supports a dielectric layer 110, such as pre-metal dielectric. The substrate 105 may include silicon, germanium, gallium arsenide, or gallium nitride, for example. The IC 100 may include transistors (not shown) formed in or over the semiconductor substrate. In the illustrated example, a first line 115 at a first metal level, e.g. metal 1 (M1) is strapped to a second metal line 125 at a second metal level, e.g. metal 2 (M2) by a plurality of strapping vias 120. The combined structure including first line 115, second line 125 and strapping vias 120 may be referred to as a strapped interconnect line 150. The strapping vias 120 are spaced apart along the strapped interconnect line 150 by a strap distance L. A metal line 140 at the metal 3 (M3) level may source current to a source end of the strapped interconnect line 150 by way of vias 130, and a metal line 145 at the M3 level may sink the current and a sink end of the strapped interconnect line 150 by way of additional vias 130. One or both of the metal lines 140 and 145 may be connected directly or indirectly to a transistor that sources or sinks the current. It is noted that the illustrated interconnection is shown without implied limitation as a representation of the general structure having enhanced EM lifetime as described herein. In other examples the first and second metal levels may be at other metallization levels of the IC 100, such as M2/M3, M3/M4, M4/M5, etc. Moreover, the source line and sink line may be absent in some other examples in which the strapped interconnect line 150 is connected directly by metal contacts at one or both ends to a corresponding transistor.

Referring to FIGS. 1A and 1B concurrently, each of the vias 120 is spaced apart from a nearest neighbor via 120 by a segment 135 of a capping dielectric, e.g. silicon nitride, silicon carbonitride, or other suitable dielectric copper barrier. Each via 120 has a first axis parallel to the direction of current flow in the first line 115, and a second axis normal to the short axis that substantially spans the width of the first metal line 115. By "substantially spans", it is meant that the second axis of the via 120 is at least 90% the width of the first metal line 115. In some examples the length of the second axis is equal to or greater than the width of the first metal line 115. The vias 120 may have an aspect ratio, e.g. the ratio of the second axis length to the first axis length, of unity (square), larger than unity, e.g. two or greater, or less than unity. Vias 120 with an aspect ratio greater or less than unity may be referred to as a "bar via".

FIG. 2 illustrates a sectional view of a single strapping via 120, showing some additional layers that are typically present in a copper interconnect. Those skilled in the pertinent art will appreciate that copper interconnects may be formed by a damascene process in which copper is electroplated into recesses in a dielectric layer. The copper is typically then polished back to the dielectric surface to define individual traces. The damascene technique typically includes various liners and capping layers, e.g. to serve as an electroplating base, to prevent copper diffusion and/or to improve adhesion. The example of FIG. 2 includes a tantalum liner 210 on the bottom and sides of the line 115, a tantalum liner layer 230 on the bottom and sides of the strapping via 120, and a tantalum liner 240 on the bottom and sides of the line 125. Dielectric cap segments 135 contact the line 115 outside the contact area of the via 120, and a dielectric cap layer 250 that may have a same composition as the dielectric cap segments 135 caps the line 125. Without implied limitation the dielectric cap segments and the dielectric cap layer 250 may substantially comprise plasma-deposited silicon nitride.

As described previously copper diffusion is understood to occur along the interface between the line 115 and the dielectric cap segments 135, or along the line 125 and the dielectric cap layer 250. It is believed that diffusion is substantially blocked along the line 115 where the tantalum liner 230 contacts the line 115. It is further believed that reducing this diffusion is sufficient to provide significant improvement of the EM lifetime of the strapped interconnect line 150, even if diffusion along the line 125 is not affected.

Experiments were performed to clarify the relationship between the strap distance L and the EM lifetime of a representative length of the strapped interconnect line 150 having a width of 0.16 μm and the strapping vias 120 being 0.15 μm square and spaced along the strapped interconnect line 150 by 0.15 μm, 1.0 μm, 10 μm, 50 μm and 100 μm. Thus the vias covered 94% of the width of the test lines. A test device having only the first line 115 was also characterized as a control comparison with a same current density as the strapped interconnect line 150.

Figure 4:
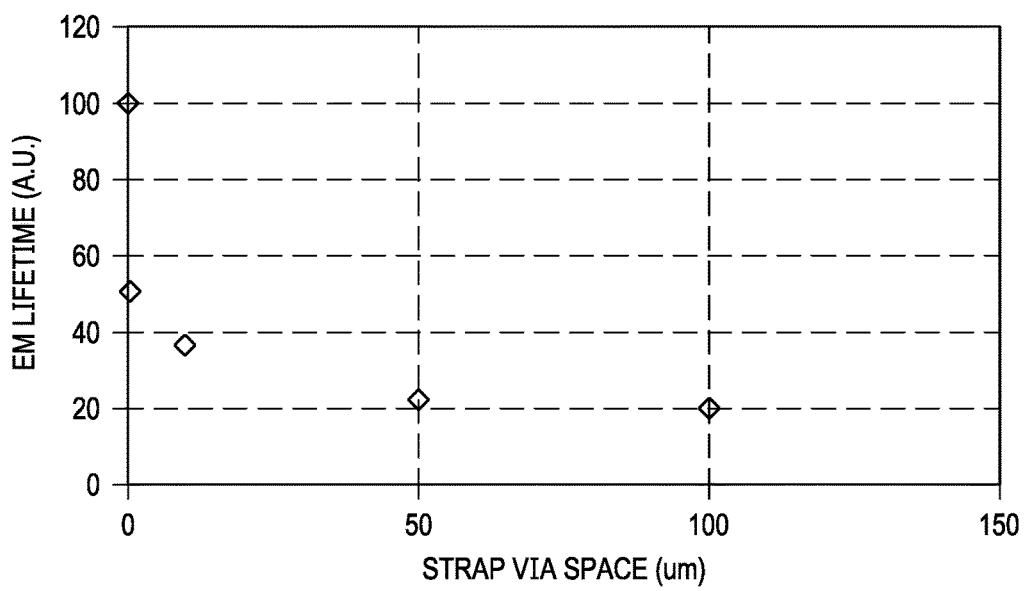
FIG. 4 show EM median lifetime in arbitrary units for the test structures presented in FIG. 3.
Figure 3:
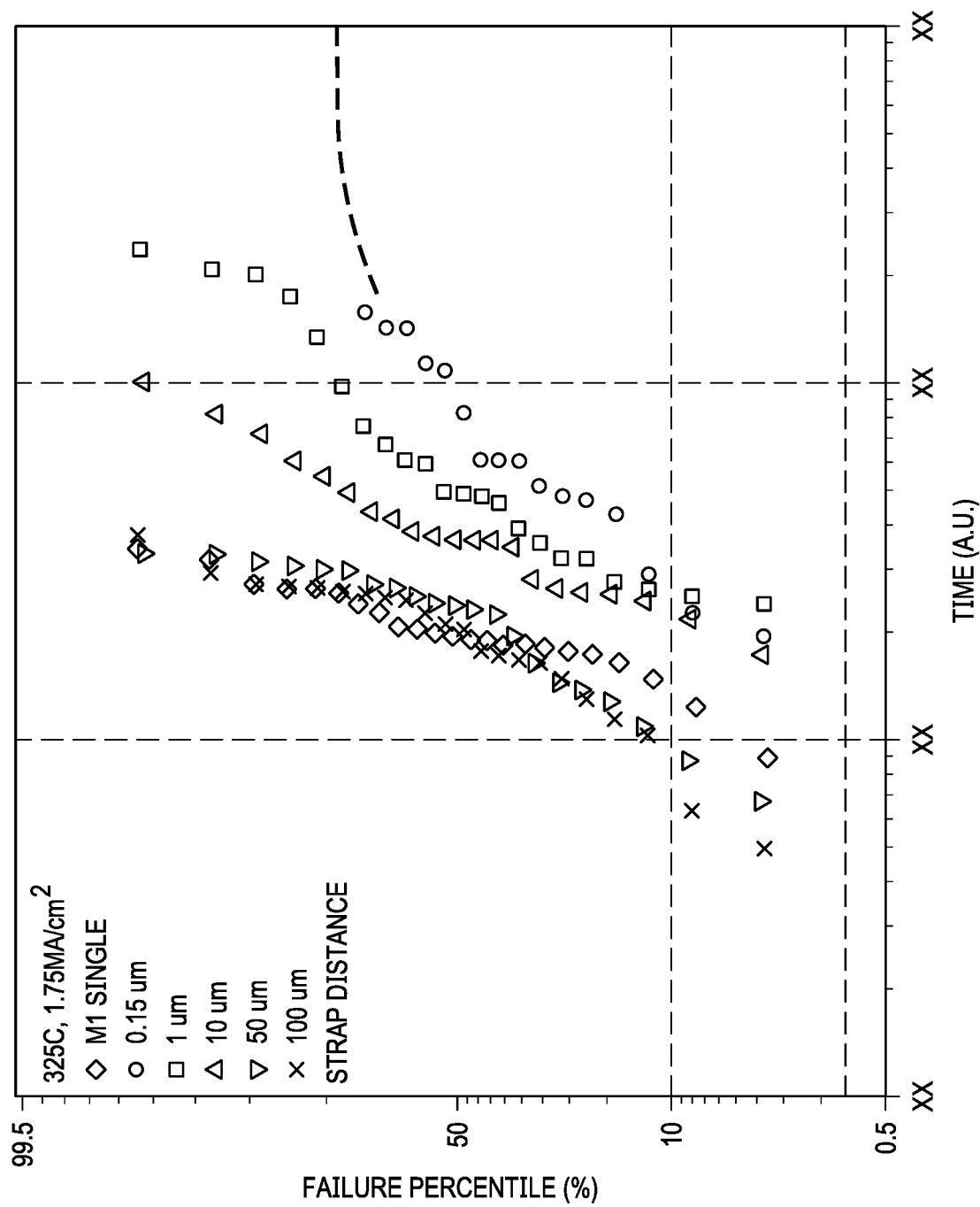
FIG. 3 presents electromigration (EM) lifetime data for several test structure consistent with the construction of the example of FIG. 1A, wherein the distance between strapping vias is different for each test structure.

FIG. 3 illustrates a log-normal probability plot of time-to-fail for populations of the 0.16 μm test devices. This figure shows a clear relationship between the strap distance L and the EM lifetime of the test devices. In particular, the test devices with a strap distance of 50 μm or greater essentially showed the same EM lifetime, while the EM lifetime becomes progressively greater for a strap distance of 10 μm, 1.0 μm and 0.15 μm. Moreover, some of the test devices with a strap distance of 0.15 μm did not fail at all under these test conditions, so-called "immortal" devices. FIG. 4 illustrates the median EM lifetime of the 0.16 μm test devices versus strap distance, showing a rapid decline in EM lifetime toward an asymptotic value of about 20% of the lifetime of the devices having a strap distance of 0.15 μm. These data suggest that the EM lifetime improvement starts on the order of 10 μm and that therefore it may be advantageous to space the strapping vias 120 no further than about 10 μm apart. While 94% overlap by the via between the sides of the test lines 94% is seen to be effective, it is believed that the benefit of the via in increasing EM lifetime may be conferred by vias spanning at least 90% of the line width, at least when approximately centered between the sides of the line.

The increased EM lifetime of the test devices with decreasing strap distance is understood to be due at least in part to blocking copper diffusion along the top of the copper lines by the tantalum liner 230 of each strapping via 120. PFA analysis of some of the devices with strap distance equal to 0.15 μm showed voiding in the M2 line 125, but not the M1 line 115, consistent with the understanding that diffusion along the M1 line is effectively suppressed by the short strap distance L, and that protecting the M1 line is sufficient to significantly increase the EM lifetime of the strapped interconnect line 150.

Figure 6:
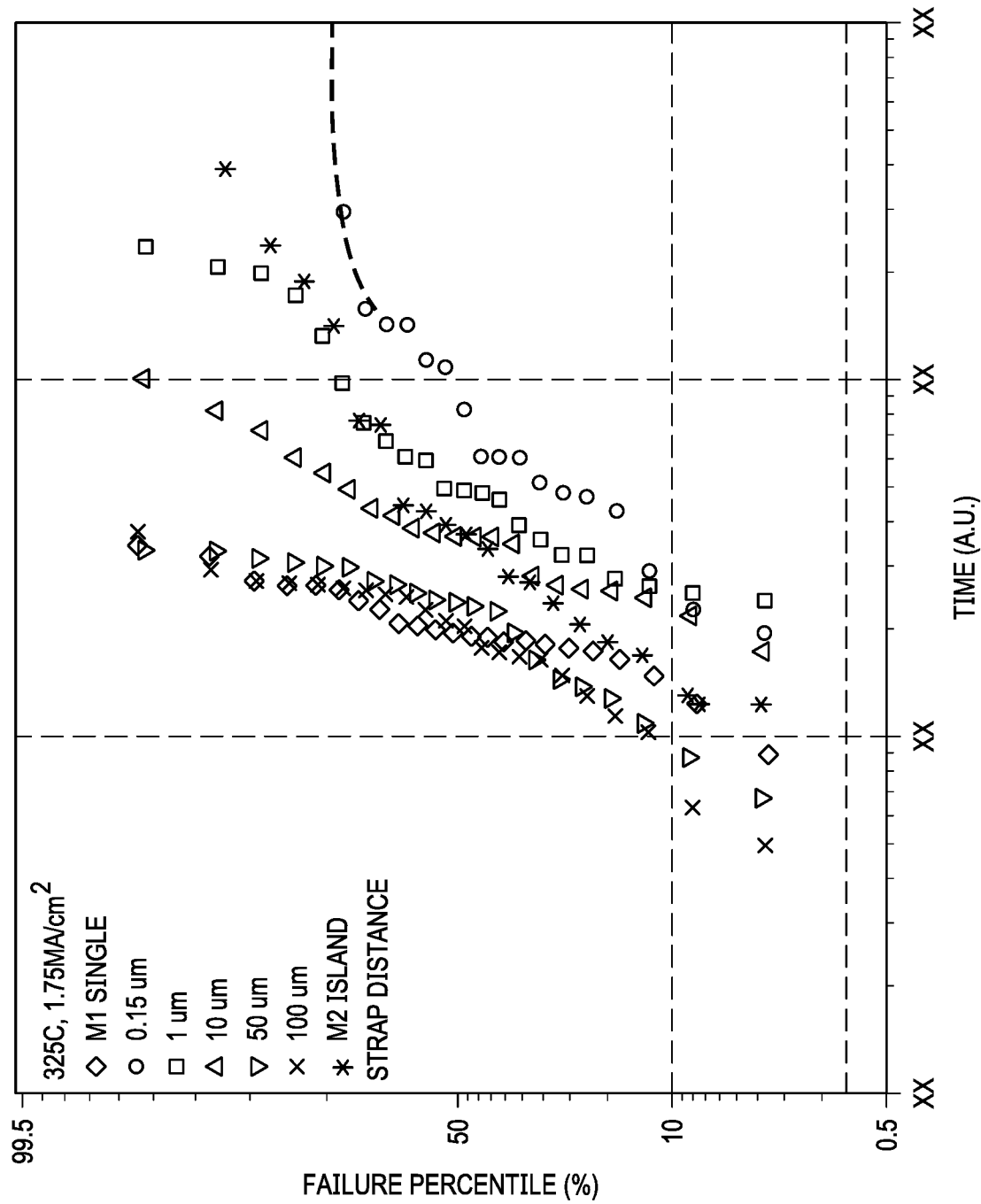
FIG. 6 presents the EM lifetime data of FIG. 3, including additional EM lifetime data for the structure of FIG. 5.

The role of the tantalum liner 230 in suppressing EM diffusion in the line 115 was further confirmed by EM lifetimes determined for an analogous test structure 500 as illustrated in FIG. 5. This figure shows the M1 line 115 similar to FIG. 1A, but omits the substrate 105 and dielectric layer 110 and the source/sink lines 140, 145 for brevity. The strapping vias 120 are spaced along the M1 line 115 as in FIG. 1A, but the M2 line 125 is replaced by M2 islands 510. Thus in the test structure 500 no current flows through the M2 layer or the strapping vias 120, but the tantalum liner 230 associated with strapping vias 120 continue to suppress diffusion along the M1 line 115. The test structure 500 was characterized only for the case that the strap distance L is 1 μm. The test current was not compensated to account for elimination of the M2 layer as a current path, so the current density in the M1 layer 115 was twice the other test devices. FIG. 6 shows the EM lifetimes of such devices 500 overlaid on the data of FIG. 3. Even with the greater current density through the M1 layer 115, the EM lifetime of the device 500 showed a clear increase, providing further confirmation of the role of the tantalum liner 230 in suppressing copper diffusion along the surface of the M1 line 115. Moreover, the greater EM lifetime of the structure 500, in spite of only having a single conducting metal level, indicates that the presence of the tantalum liner 230 in the strapped interconnect line 150 has a synergistic effect that results in the strapped interconnect line 150 having a current-carrying capability more than two times the current-carrying capability of an analogous strapped line with conventional strapping vias with spaces between them.

Figure 7:
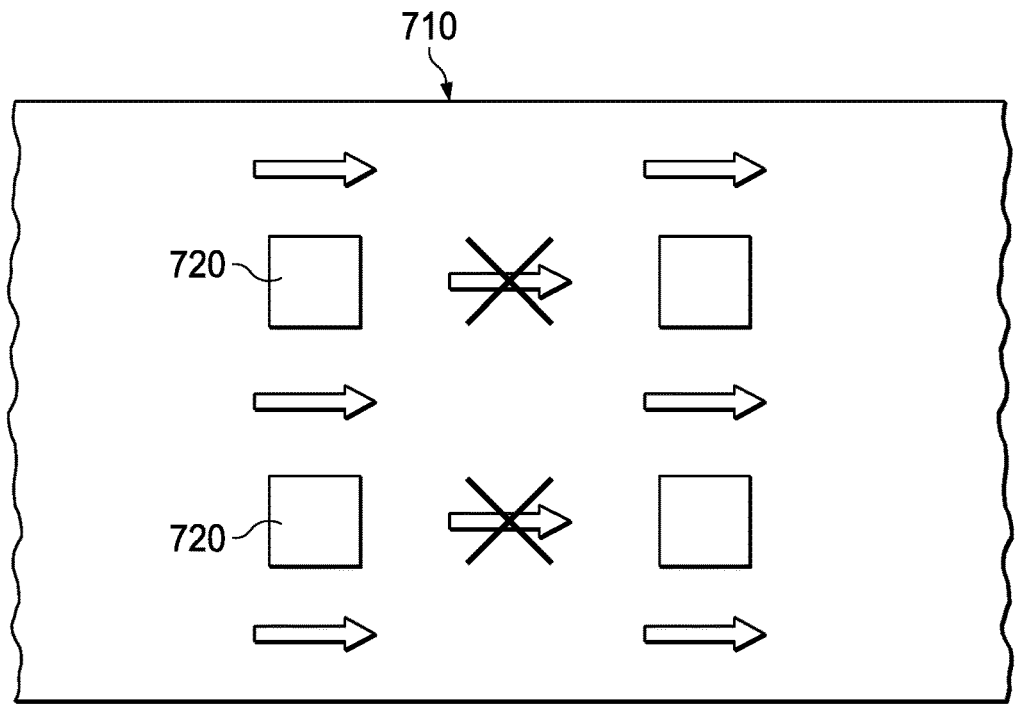
FIG. 7 schematically illustrates copper diffusion paths between spaced-apart vias contacting a wide metal line.

This principle is further illustrated with reference to FIG. 7, which illustrates spaced-apart vias on a wide line, e.g. about 1 μm. For wide linewidths, e.g. wide enough to accommodate two square vias at minimum design rules and associated spaces between the vias and the lie edges, columns of multiple square strapping vias may be conventionally placed along a long strapped line. However, experimental data confirmed that closely spacing the via columns along a 1 μm line provided no measurable improvement of EM lifetime of the wide line. This result is understood to support the conclusion that gaps between the strapping vias allow copper diffusion to occur at a sufficient rate that the copper diffusion is not limited to a distance similar to the Blech length. This effect is illustrated schematically in FIG. 7, which shows a line segment 710 and a number of vias 720. Arrows directed between the vias, or between the vias and the side of the line segment, illustrate paths through which copper can diffuse along the line 710, while blocked directly between vias in the horizontal direction. Thus the inventors conclude that effectively limiting the copper diffusion under EM test conditions requires that the tantalum liner associated with the strapping via effectively extend continuously from one side of the strapped interconnect line 150 to the opposite side of the strapped interconnect line 150.

The synergistic effect of the strapping vias that extend completely from one side of the strapped line to the opposite side of the strapped line is an unexpected result, and to the inventors' knowledge a hitherto unobserved effect, wherein the maximum sustainable current for a strapped interconnect line 150 is greater than the sum of the maximum sustained current through each individual interconnect line, e.g. the lines 115 and 125. This effect allows the strapped interconnect line 150 to be narrower than conventionally possible for a given current-carrying capacity, which in turn allows for a reduced die size of the IC of which the strapped interconnect line 150 is a part.

FIGS. 8A/8B through 11A/11B illustrate some principles of this work in two sets of examples. FIGS. 8A/8B illustrate a narrow strapped line 810 that includes M1 and M2 lines connected to an M3 feeder 820. The M1 and M2 lines are connected by strapping vias 830 that are conventionally spaced apart from sides of the strapped line 810 by a nonzero value. Those skilled in the art will appreciate that conventionally design rules typically require such spacing to ensure a via fully lands on the line to which it connects when accounting for alignment tolerances between the via level and the line levels. As demonstrated by the discussion above, these conventional spaces allow copper diffusion around the via 820, with resulting reduced EM lifetime.

FIGS. 9A/9B illustrate a narrow strapped line 910 that includes M1 and M2 lines connected to an M3 feeder 920. The M1 and M2 lines are connected by strapping vias 930 that extend continuously from one side of the strapped line 910 to the opposite side of the strapped line 910, according to the disclosure. As demonstrated above, the EM lifetime of the strapped line 910 is expected to be significantly larger than that of the strapped line 810 when the spacing between the strapping vias 930 is less than 10 μm.

Analogously to FIGS. 8A/8B, FIGS. 10A/10B illustrate a wide strapped line 1010 that includes M1 and M2 lines connected to an M3 feeder 1020. The M1 and M2 lines are connected by strapping vias 1030 that are conventionally spaced apart from each other and from sides of the strapped line 1010 by a nonzero value. Again, such spaces allow copper diffusion around the vias 1030, with resulting reduced EM lifetime of the wide strapped line 1010.

FIGS. 11A/11B illustrate a wide strapped line 1110 that includes M1 and M2 lines connected to an M3 feeder 1120. The M1 and M2 lines are connected by strapping vias 1130 that extend continuously from one side of the strapped line 1110 to the opposite side of the strapped line 1110, according to the disclosure. The vias 1130 have a first axis parallel to the direction of current flow, and a second axis normal to the direction of current flow. In this example the vias 1130 are bar vias.

Vias typically have one of a small number of allowed sizes in a design rule set, for example 0.15 μm. In the example of the via 1130, the length of the first axis may remain consistent with an allowed via size, e.g. for consistent process control, but the length of the second axis is allowed to span at least 90% of the width of the strapped line 1110, including 94%, 100% (zero overlap via) and greater than 100% (overhanging via). Thus there may be zero overlap between the strapping via 1130 and the strapped line 1110 as shown in the example of FIG. 11B. Such examples are counter to conventional practice, which typically enforces minimum non-zero overlap between vias and overlying or underlying lines. The wide strapped line 1110 may have a width of about 1 μm in some examples. With a width of 0.15 μm, the aspect ratio of the strapping vias 1130 may be about seven. Similarly, the zero-overlap of the square strapping vias 930 with respect to the strapped line 910 typically violates conventional design rules. Being square, the strapping vias 930 have an aspect ratio of unity, and the strapped interconnect line 150 may be as narrow as the width of the strapping vias 930.

While there is no limitation on the spacing of the strapping vias 1130 along the strapped line 1110, the data described above indicates greater benefit is conferred when the vias 1130 are no further apart than the Blech length. Since this length may be difficult to precisely determine, the strapping vias 1130 may be spaced as closely as allowed by the applicable design rules. In some examples this minimum spacing may be about equal to the width of the strapping vias 1130, e.g. about 0.15 μm in the current example. However, as demonstrated by FIG. 3, benefit may be obtained when the spacing between the strapping vias 1130 is no greater than 10 μm.

Figure 12:
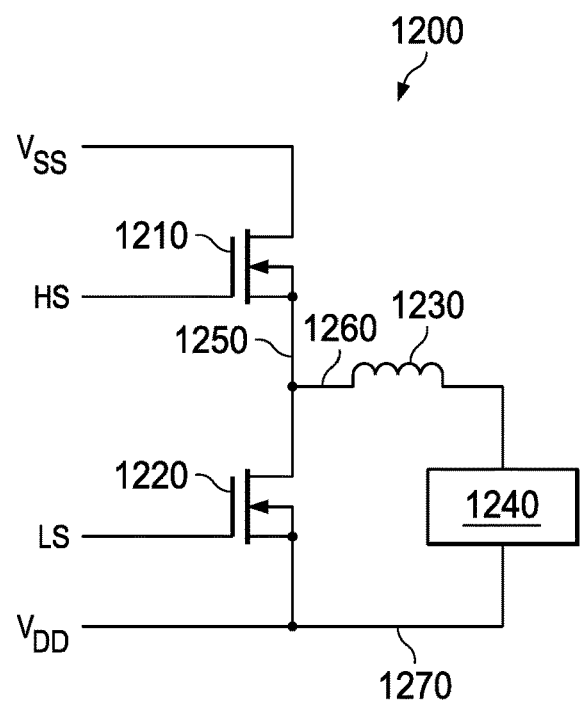
FIG. 12 illustrates use of a strapped interconnect connect according to the disclosure in an example transistor circuit of an integrated circuit.

Finally, FIG. 12 illustrates an example portion of an integrated circuit 1200 including transistors 1210 and 1220. The circuit 1200 is configured as a switching power converter and includes an inductor 1230 and a load 1240. Circuit paths 1250, 1260 and 1270 may conduct a high current during operation. Therefore one or more of these paths may be configured consistent with examples described herein, e.g. the strapped interconnect line 150. In various examples the transistors 1210, 1220 may be laterally-diffused MOS (LDMOS) power transistor, or a gallium arsenide (GaN) power transistor. Due to the use of the strapped line for the high-current paths 150, 1260 and 1270, these paths may be narrower than conventionally possible for the same current load and EM lifetime. Thus the IC 1200 may smaller than would otherwise be possible without including current paths consistent with the strapped interconnect line 150.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A semiconductor device, comprising:
   a strapped interconnect line, including a first interconnect line at a first level above a semiconductor substrate and a second interconnect line at a second level above the semiconductor substrate;
   a plurality of strapping vias spaced apart between a source end and a sink end of the strapped interconnect line, the vias connected between the first interconnect line and the second interconnect line;
   a third interconnect line at a third level above the semiconductor substrate electrically connected to the strapped interconnect line at the source end; and
   a fourth interconnect line at the third level electrically connected the strapped interconnect line at the sink end.

2. The semiconductor device of claim 1, wherein each of the strapping vias covers at least about 90% of a width of the first interconnect line.

3. The semiconductor device of claim 1, wherein each of the strapping vias covers at least about 94% of a width of the first interconnect line.

4. The semiconductor device of claim 1, wherein each strapping via is spaced from a nearest neighbor strapping via toward the source end or the sink end by no more than 10 μm.

5. The semiconductor device of claim 1, wherein each strapping via is spaced from a nearest neighbor strapping via toward the source end or the sink end by less than 1 μm.

6. The semiconductor device of claim 1, wherein each strapping via has a first axis with a length along a first direction between the source end and the sink end and a second axis with a width in a second direction normal to the first direction, and each strapping via is spaced apart from a nearest neighbor strapping via by about the length of the first axis.

7. The semiconductor device of claim 1, wherein each instance of the strapping via includes a tantalum liner that directly contacts the first interconnect line.

8. The semiconductor device of claim 1, wherein each strapping via has a first axis with a length along a first direction between the source end and the sink end and a second axis with a width in a second direction normal to the first direction, and the first axis and the second axis have a same length.

9. The semiconductor device of claim 1, wherein each strapping via has a first axis with a length along a first direction between the source end and the sink end and a second axis with a width in a second direction normal to the first direction, and the second axis is at least two times longer than the first axis.

10. The semiconductor device of claim 1, further comprising a transistor configured to source or sink current through the strapped interconnect line.

11. The semiconductor device of claim 10, wherein the transistor is a laterally-diffused MOS (LDMOS) transistor.

12. The semiconductor device of claim 1, wherein the first and second interconnect lines and the strapping vias are formed from copper.

13. The semiconductor device of claim 1, further comprising a dielectric capping layer located directly on the first interconnect line.

14. The semiconductor device of claim 1, wherein the third interconnect line is connected to the source end by first interconnect vias over the strapping vias, and the fourth interconnect line is connected to the sink end by second interconnect vias over the strapping vias.

15. A method of forming a semiconductor device, comprising:
    forming a strapped interconnect line, including forming a first interconnect line at a first level above a semiconductor substrate and forming a second interconnect line at a second level above the semiconductor substrate;
    forming a plurality of strapping vias spaced apart between a source end and a sink end of the strapped interconnect line, the vias connected between the first interconnect line and the second interconnect line;
    forming a third interconnect line at a third level above the semiconductor substrate electrically connected to the strapped interconnect line at the source end; and
    forming a fourth interconnect line at the third level electrically connected to the strapped interconnect line at the sink end.

16. The method of claim 15, wherein each of the strapping vias covers at least about 90% of a width of the first interconnect line.

17. The method of claim 15, wherein each of the strapping vias covers at least about 94% of a width of the first interconnect line.

18. The method of claim 15, wherein each strapping via is spaced from a nearest neighbor strapping via toward the source end or the sink end by less than 10 μm.

19. The method of claim 15, wherein each strapping via is spaced from a nearest neighbor strapping via toward the source end or the sink end by less than 1 μm.

20. The method of claim 15, wherein each strapping via has a first axis with a length along a first direction of current flow through the first interconnect line and a second axis with a width in a second direction normal to the first direction, and each strapping via is spaced apart from a nearest neighbor strapping via by about the length of the first axis.

21. The method of claim 15, wherein each instance of the strapping via includes a tantalum liner that directly contacts the first interconnect line between that instance of the strapping via and the first interconnect line.

22. The method of claim 15, wherein each strapping via has a first axis with a length along a first direction between the source end and the sink end and a second axis with a width in a second direction normal to the first direction, and the first axis and the second axis have a same length.

23. The method of claim 15, wherein each strapping via has a first axis with a length along a first direction between the source end and the sink end and a second axis with a width in a second direction normal to the first direction, and the first axis is at least two times longer than the second axis.

24. The method of claim 15, further comprising forming a transistor in or over the semiconductor substrate configured to source or sink current through the strapped interconnect line.

25. The method of claim 24, wherein the transistor is a laterally-diffused MOS (LDMOS) transistor.

26. The method of claim 15, wherein the first and second interconnect lines and the strapping vias are formed from copper.

27. The method of claim 15, further comprising forming a dielectric capping layer directly on the first interconnect line.

28. The method of claim 15, wherein the third interconnect line is connected to the source end by first interconnect vias over the strapping vias, and the fourth interconnect line is connected to the sink end by second interconnect vias over the strapping vias.

* * * * *